United States Patent [19]

Kane

[11] Patent Number: 4,780,890
[45] Date of Patent: Oct. 25, 1988

[54] HIGH-SPEED PULSE SWALLOWER

[75] Inventor: Michael G. Kane, Rocky Hill, N.J.

[73] Assignee: Microwave Semiconductor Corp., Somerset, N.J.

[21] Appl. No.: 913,050

[22] Filed: Sep. 29, 1986

[51] Int. Cl.[4] .......................... H04L 7/00; H04J 3/06
[52] U.S. Cl. ..................................... 375/106; 307/269; 370/102
[58] Field of Search ............... 375/110, 106, 112, 113; 328/139; 307/528, 527, 269

[56] References Cited

U.S. PATENT DOCUMENTS

| | | | |
|---|---|---|---|
| 3,755,748 | 8/1973 | Carlow et al. | 375/106 |
| 4,131,854 | 12/1978 | Schollmeier | 375/106 |
| 4,191,849 | 3/1980 | Vrba | 375/106 |
| 4,578,799 | 3/1986 | Scholl et al. | 375/110 |

Primary Examiner—Stephen C. Buczinski
Assistant Examiner—Linda J. Wallace
Attorney, Agent, or Firm—John Francis Moran

[57] ABSTRACT

A pulse swallower 41 utilizes a local feedback loop (51 and 52) on its output flip-flop (49) enabling it to extinguish its high level output after one cycle of the clock signal being applied as an input. The other input to the pulse swallower is the swallow signal which initiates a pulse swallow cycle for eliminating a single clock pulse of the input clock (42) from appearing at the clock output (44). This configuration of a pulse swallower enables correct operation, or single pulse swallowing, to occur at frequencies of up to one-over-four $\tau(\frac{1}{4}\tau)$ which is higher than that of conventional pulse swallowers.

10 Claims, 4 Drawing Sheets

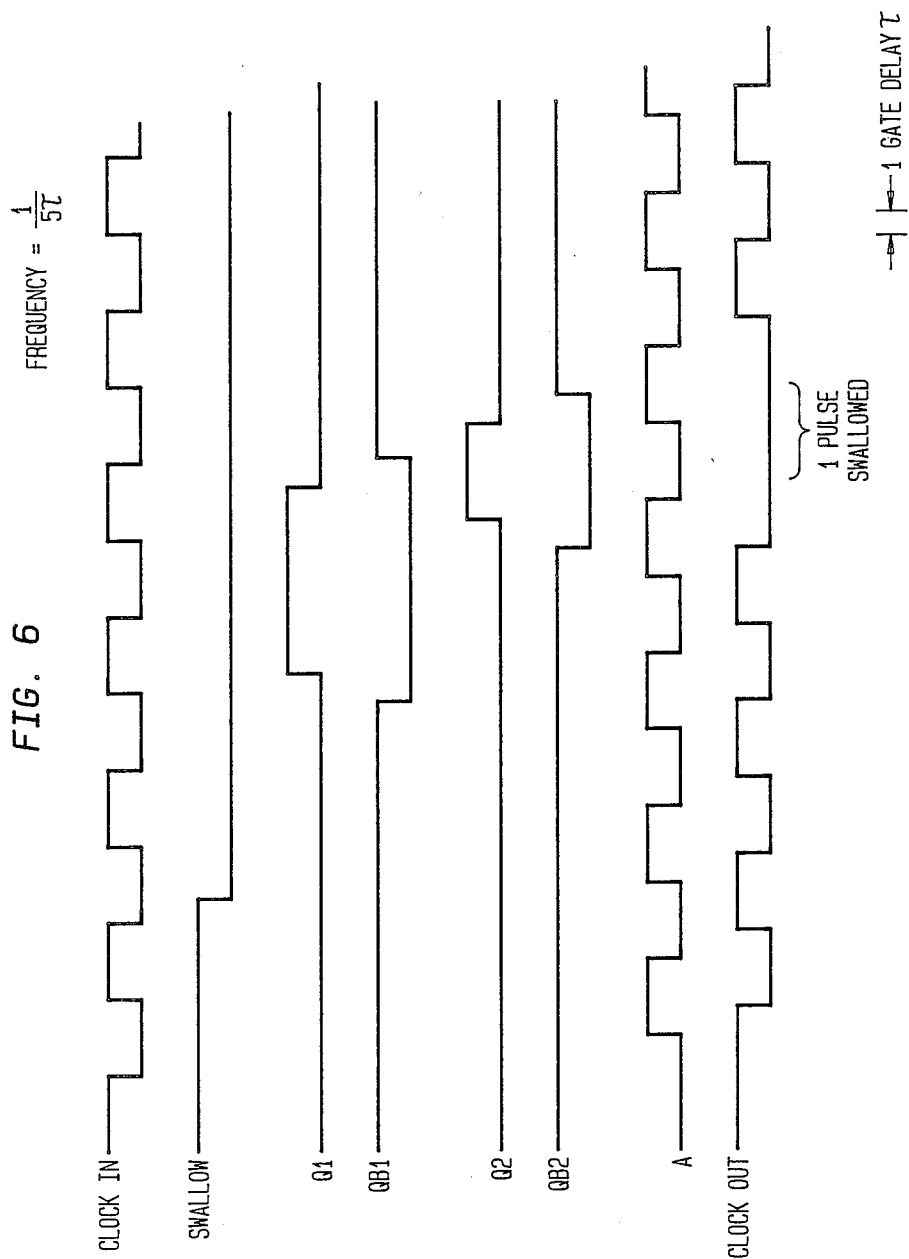

HIGH-SPEED PULSE SWALLOWER

BACKGROUND OF THE INVENTION

This invention relates to digital timing circuitry, and it relates, more particularly, to a synchronization circuit which operates while the digital system clock is running to skip a clock pulse to achieve synchronization.

In time-division multiplexed digital communication systems, an operation known as demultiplexing requires synchronization in order to divide a serial data stream properly into a number of channels. Various techniques have been devised to achieve and maintain synchronization through out digital communication systems. For example, one technique called pulse stuffing is often used to insure that synchronization is maintained by providing an appropriate signal format in serial transmission systems. Another somewhat conversely related technique involves achieving synchronization by removing clock pulses from a series of clock pulses in response to a command or control signal. This technique is useful in synchronous digital systems wherein a machine cycle is composed of multiple clock cycles. All parts of the system must begin their machine cycles on the same cycle in order for the system to function synchronously. A circuit known as a pulse swallower is able to achieve synchronization for one part of a system while the system is running by swallowing clock pulses entering that part of the system until synchronization occurs.

For a variety of reasons, a trend has developed wherein digital systems operate at increasingly faster and higher rates. Conventional pulse swallowers are limited due to their circuit configurations to a maximum operating frequency of one over six $\tau$ ($1/6\ \tau$) where $\tau$ corresponds to the average delay interval associated with the operation of a typically loaded gate. In terms of the duration of a clock cycle, the period of the clock cycle must be no shorter than six $\tau$. Although integrated circuit technologies have developed with less delay to reduce the value of $\tau$, the previous frequency constraint of conventional pulse swallowers still presents a degradation in the maximum frequency of operation of digital communication systems.

SUMMARY OF THE INVENTION

It is an object of the present invention to provide a synchronization circuit configuration capable of reliable operation at clock frequencies up to one over four $\tau$ ($\frac{1}{4}\ \tau$).

It is a related object to provide a pulse swallower utilizing a local feedback loop as a speed enhancement technique.

In an illustrative embodiment of a pulse swallower in accordance with the invention, logical means is provided for enabling a gate in a signal path for clock pulses and for disrupting the signal path by disabling the gate for a predetermined interval in response to a control signal which eliminates only one clock pulse at an input clock frequency corresponding to the reciprocal of four gate delay intervals where each gate delay interval is the average loaded gate delay of the gates used in the embodiment.

In some of the aspects of the invention, logical circuitry receives the control signal and produces the enable signal which extinguishes itself four gate intervals after the end of a pulse of the input clock signal. The logical circuitry includes two bistable circuits; one bistable circuit has an input for recieving the control signal while the other has an input for receiving the input clock signal. Each bistable circuit has a data input and one data output. The data input of the first bistable circuit has a fixed high level signal applied thereto and its one data output is applied to the data input of the second bistable circuit. The one data output of the second bistable circuit provides the enabling signal for the gate in the signal path.

In some of the further aspects of the invention, the second bistable circuit has a complementary data output of the one data output. The complementary data output is connected to another data input of second bistable circuit to serve a local feedback loop for extinguishing the enable signal in its high state after one clock cycle. The first bistable circuit is a D-type flip-flop having a reset input. The one data output of the second bistable circuit is applied to the reset input. The signal path includes a serially connected inverter and a NOR gate which serves as the gate responsive to the control signal input for selectively eliminating single clock pulses.

BRIEF DESCRIPTION OF THE DRAWING

Features of the invention and additional objects of the invention will be more readily appreciated and better understood by reference to the following detailed description which should be considered in conjunction with the drawing.

FIG. 6 is a waveform diagram illustrating normal operation of the pulse swallower of FIG. 4 under the same conditions as those utilized in FIG. 3.

DETAILED DESCRIPTION

Figure 1:
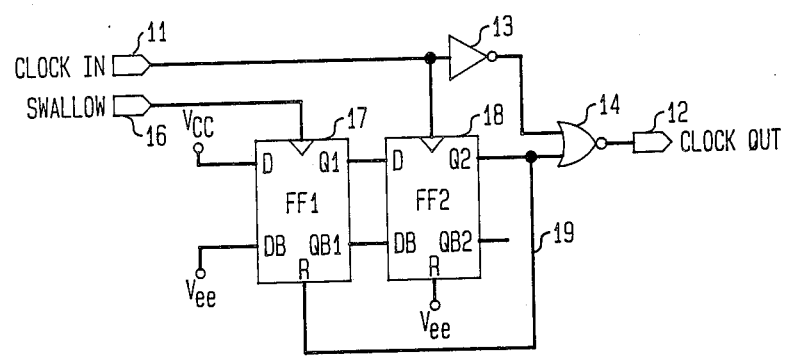
FIG. 1 is a circuit diagram of a conventional pulse swallower.

FIG. 1 provides a circuit diagram for a typical conventional pulse swallower. Basically, the circuit of FIG. 1 has a clock signal applied to input 11 and delivers an output clock signal at output 12. Generally, the output corresponds to the input except for the delay introduced by inverter 13 and NOR gate 14 which becomes more significant as the frequency of the clock signal is increased.

In response to a negative transition of the swallow signal applied to input 16, which is the clock input of flip-flop 17, the Q1 output goes high. Upon the occurrence of the next negative transition of the clock signal, the Q2 output of flip-flop 18 goes to a high state. At the time that Q2 goes high, the output of inverter 13 remains high while the output of NOR gate 14 is low. After Q2 goes high, the output of NOR gate 14 remains low even after the input clock signal goes high.

At this point in time, the clock swallowing cycle begins. In addition to forcing the output of NOR gate 14 low, the high level on Q2 resets flip-flop 17 via conductor 19; as a result the Q1 output of that flip-flop returns to a low level. The next negative transition of the input clock signal passes the Q1 low level on to the Q2 output of flip-flop 18. Once Q2 is at a low level, the output of NOR gate 14 can once again change in response to the changes of the clock signal at input 11. However, at the same time Q2 of flip-flop 18 returns to a low level, the input clock signal is low, the output of inverter 13 is high, and the output of NOR gate 14 remains low until the next positive edge of the clock input signal. Thus one entire clock pulse has been swallowed by the circuit response to a falling edge or transition of the swallow signal.

Figure 2:
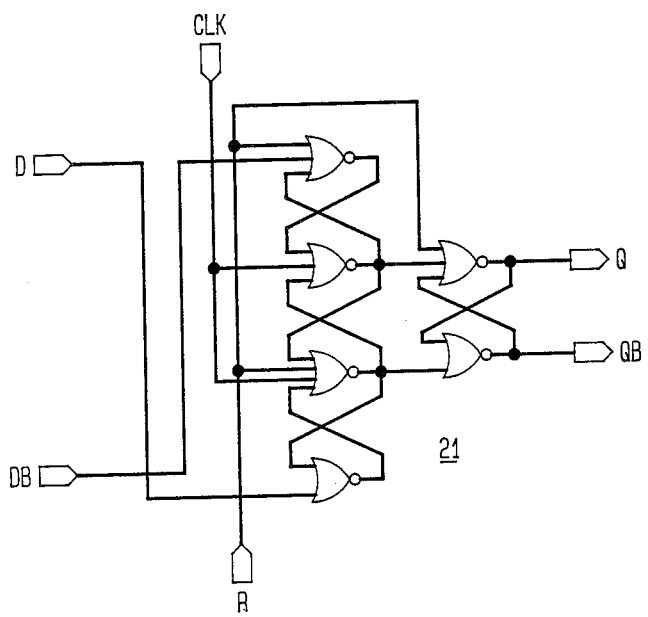
FIG. 2 is an internal diagram of flip-flop suitable for the pulse swallower of FIG. 1.

FIG. 2 provides a gate level internal diagram of D-type flip-flop 21 which is suitable for both flip-flop 17 and 18 in FIG. 1. Flip-flop 21 has complementary data inputs, D and DB, and complementary outputs are Q and QB. In addition, flip-flop 21 has a clock input and a reset input. Since such D-type flip-flops are well known to those skilled in the art, further discussion of its internal operation is not warranted. However, the overall operation of the pulse swallower of FIG. 1 at high clock frequencies is important to understanding the full significance of the present invention.

Figure 3:
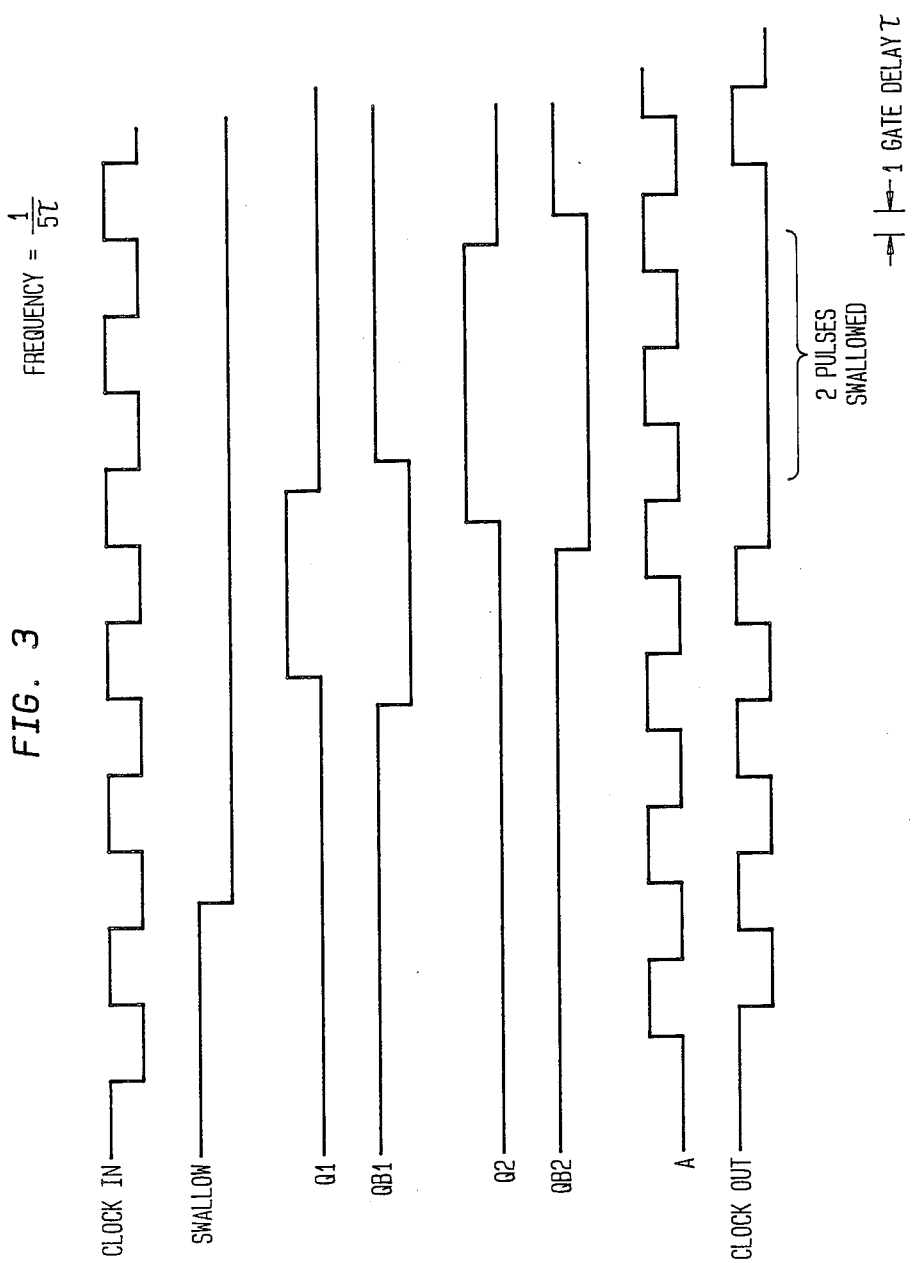
FIG. 3 is a waveform diagram illustrating faulty operation of the pulse swallower of FIG. 1 under certain conditions.

FIG. 3 is a waveform diagram illustrating operation of the pulse swallower of FIG. 1 at a clock frequency equal to one over five $\tau$ (1/5 $\tau$). As expected, in response to negative edge of the swallow signal one loss clock pulse should be present at output 12. The clock signal input is at the top of FIG. 3 while the clock output appears at the bottom of FIG. 3. What is evident is that two clock pulses are swallowed. It should be pointed out that when clock pulses are not being swallowed, the speed of circuit operation is only limited by the bandwidth of serially connected inverter 13 and NOR gate 14.

During a clock swallowing cycle however, the speed of operation is limited by the time required for Q2 to go low for enabling NOR gate 14. This requires flip-flop 17 to be reset, and for the Q1 output of that flip-flop to be adequately established at the correct level as an input signal to D of flip-flop 18. The delay between the falling edge of the input clock and Q2 going high is three $\tau$, where $\tau$ is the average loaded gate delay. The delay between Q2 going high and flip-flop 17 resetting is two $\tau$. The set-up time of flip-flop 18 is also $\tau$. Thus, the total amount of time that must be available during the clock swallowing cycle is six $\tau$. As a result, the maximum frequency of operation s one over six $\tau$ (1/6$\tau$). The addition of a conventional pulse swallower to the fastest counters available which are capable of operating at frequencies up to $\frac{1}{4}\tau$ will reduce the frequency of operation by about one third or 33%.

In FIG. 3, the complementary outputs of both flip-flops 17 and 18 are shown. In addition, waveform A is the output of inverter 13. The signal is an inversion of the clock input signal delayed by the response time of inverter 13. The output clock signal available at terminal 12 is again inverted by NOR gate 13 as well as slightly delayed.

Figure 4:
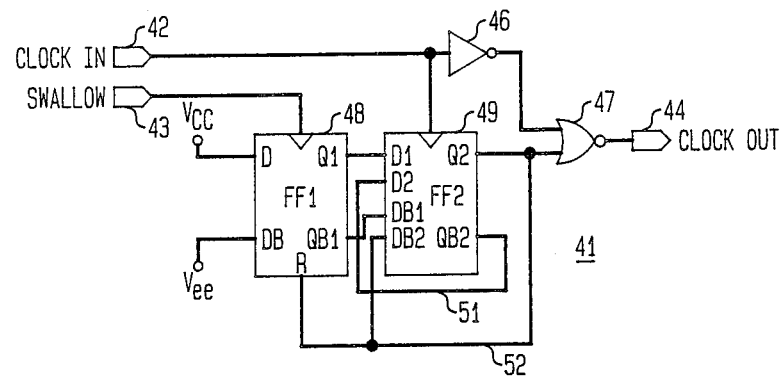
FIG. 4 is a circuit diagram of a pulse swallower in accordance with the invention.
Figure 5:
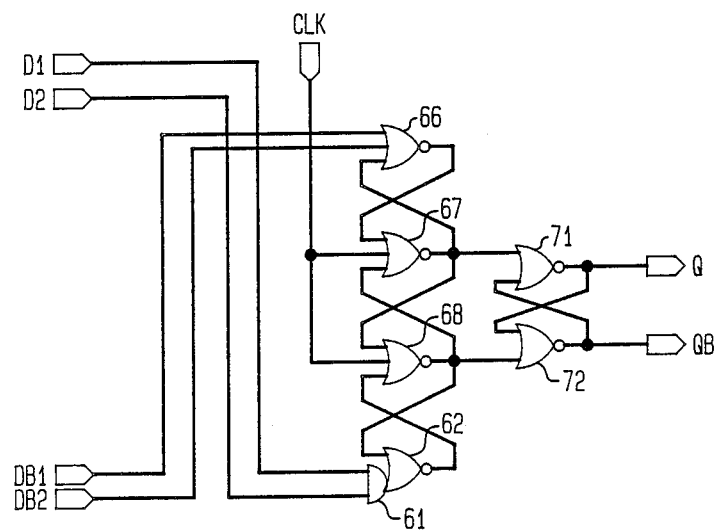
FIG. 5 is a gate level diagram of a suitable flip-flop advantageously employed in the output portion of the pulse swallower of FIG. 4.

FIG. 4 is a diagram of pulse swallower 41 in accordance with the principles of the present invention. As one would expect, pulse swallower 41 has equivalent inputs and an equivalent output to that of the pulse swallower of FIG. 1. In fact, inputs 42, 43 and output 44 including inverter 46, NOR gate 47 and flip-flop 48 are identical to the corresponding elements in FIG. 1. The primary differences between the pulse swallower of FIG. 4 from that of FIG. 1 lie in the way flip-flop 49 is connected and its internal circuitry which is depicted in FIG. 5. These differences enable the pulse swallower of FIG. 4 to operate correctly at frequencies of up to one over four $\tau$ ($\frac{1}{4}\tau$). Accordingly when this pulse swallower is used in conjunction with a high speed counter, no degradation or reduction is experienced in the maximum operating frequency of the overall circuit.

As is evident from the circuit of FIG. 4, a local feedback loop via conductors 51 and 52 around flip-flop 49 forces this flip-flop to terminate the high state signal at its Q2 output after one cycle of the input clock signal. Therefore since this feedback loop does not include flip-flop 48, it is much faster than the equivalent feedback loop of FIG. 1 on conductor 19.

The delays associated with the local feedback loop on conductor 51 will now be described. As previously described in connection with the pulse swallower of FIG. 1, the delay between the falling edge of the input clock signal and the changing states of the signal at Q2 and QB2 is still three $\tau$, and the set-up time of flip-flop 49 is $\tau$.

FIG. 5 illustrates the internal circuitry of flip-flop 49. The local feedback of conductor 51 provides one input to AND gate 61 which is integrated with NR gate 62 which it feeds. In other words, AND gate 61 and NR gate 62 form a single composite AND-OR-INVERT gate. It should also be pointed out that the additional NOR gates in FIG. 5 which receive inputs (NOR gates 66-68) are cross coupled together with AND-OR-INVERT gate 61,62. This highly paralled arrangement provides concurrent operation of the associated gates for providing quick intermediate inputs to output NOR gates 71 and 72.

With the foregoing in mind, attention is directed to the overall pulse swallower of FIG. 4. It therefore becomes apparent that the total amount of time that must be available during the clock swallowing cycle is four $\tau$. Thus, the maximum frequency of operation is one-over-four $\tau(\frac{1}{4}\tau)$. As a result, the utilization of a pulse swallower according to FIG. 4 enables a high speed counter to operate at the highest speed which it is capable of operating.

FIG. 6 provides a timing waveform diagram for the pulse swallower of FIG. 4. This timing waveform diagram provides the digital signals of the pulse swallower of FIG. 4 which correspond to those of the pulse swallower of FIG. 1. However, the clock output signal line at the bottom of FIG. 6 clearly illustrates that only one pulse is swallowed as desired for correct operation. Although the operating frequency is one-over-five $\tau$ (1/5$\tau$), this operation will continue up to frequencies of one-over-four $\tau$ ($\frac{1}{4}\tau$).

There has thus been shown and described a novel pulse swallower which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claim which follow.

I claim:

1. Apparatus having controlling means and a signal path responsive to the controlling means, the signal path receiving an input clock signal of successive clock pulses occurring at a clock signal frequency and a control signal applied to the controlling means for providing an output clock signal from the signal path wherein one clock pulse among successive clock pulses of the input clock signal is prevented from appearing at the output clock signal in response to the control signal, the apparatus comprising: a signal path for receiving the input clock signal and producing the output clock signal; controlling means, responsive to the control signal for controlling the signal path, including logical means comprising logical elements each having an average propagation delay interval, the controlling means comprising serially connected first and second bistable means, each having at least two inputs and at least two outputs, for producing an output signal, the controlling means further comprising first and second logical feedback paths, the first logical feedback path connected between an output of the second bistable means and an input of the first bistable means, the second logical feedback path connected to another output of the second bistable means and coupled back to another input of the second bistable means, the first and second logical feedback means controlling the duration of the output signal produced in response to the control signal, the controlling means normally allowing the clock signal to traverse the signal path while the first and second logical feedback means prevents the occurrence of a single clock pulse in the output clock signal in response to the control signal by controlling the duration of the output signal for a range of clock signal frequencies including a maximum frequency which is the reciprocal of four propagation delay intervals.

2. Apparatus according to claim 1 wherein said signal path includes logical gating means for receiving the input clock signal and the output signal, and the first and second logical feedback means extinguish the output signal after one input clock signal cycle.

3. Apparatus according to claim 2 wherein the first bistable means has an input for receiving control signal, the second bistable means has an input for receiving the input clock signal, these two inputs are data inputs and the two outputs are data outputs, a first data input of the first bistable means connected to receive a high level signal and a first data input of the second bistable means connected to a data output of the first bistable means, and a data output of the second bistable means providing the output signal for the logical gating means.

4. Apparatus according to claim 3 wherein the second bistable means includes a second set of data inputs, the second logical feedback means connected between a data output complementary to the output signal and the complementary data input to the first data input of the second bistable means.

5. Apparatus according to claim 3 wherein the second bistable means includes a second data output and an AND-OR-INVERT gate having two inputs, one serves as the data input and the other serves as a second data input, the second data input is connected to the second data output to form a local feedback loop.

6. Apparatus according to claim 4 wherein the second output is a complementary data output of the one data output.

7. Apparatus according to claim 5 wherein the first bistable means is a D-type flip-flop having a reset input.

8. Apparatus according to claim 6 wherein the one data output of the second bistable means is connected to the reset input of D-type flip-flop.

9. Apparatus according to claim 7 wherein the logical gating means comprises a NOR gate having first and second inputs, and an inverter for inverting the input clock signal before application to the first input.

10. Apparatus according to claim 8 wherein the first input of the NOR gate is connected to receive the input clock signal and the second input is connected to receive the one data output of the second bistable means.

* * * * *